(12) United States Patent
Tamura

(10) Patent No.: US 8,450,718 B2
(45) Date of Patent: May 28, 2013

(54) SEMICONDUCTOR LIGHT EMITTING DEVICE AND A PRODUCTION METHOD THEREOF

(75) Inventor: Wataru Tamura, Yokohama (JP)

(73) Assignee: Stanley Electric Co., Ltd., Tokyo (JP)

(*) Notice: Subject to any disclaimer, the term of this patent is extended or adjusted under 35 U.S.C. 154(b) by 119 days.

(21) Appl. No.: 13/048,520

(22) Filed: Mar. 15, 2011

(65) Prior Publication Data

US 2011/0227038 A1 Sep. 22, 2011

(30) Foreign Application Priority Data

Mar. 19, 2010 (JP) .................................. 2010-064775

(51) Int. Cl.
*H01L 29/06* (2006.01)
(52) U.S. Cl.
USPC .................. 257/13; 257/88; 257/E25.019
(58) Field of Classification Search
CPC ....................................................... B82Y 20/00
USPC .................. 257/13–15, 88–103, 79, E25.019, 257/E25.028, E21.349
See application file for complete search history.

(56) References Cited

U.S. PATENT DOCUMENTS

| | | | |
|---|---|---|---|
| 5,008,718 A | | 4/1991 | Fletcher et al. |
| 5,537,433 A | * | 7/1996 | Watanabe ................... 372/45.01 |
| 5,621,747 A | * | 4/1997 | Kitoh et al. ................. 372/45.01 |
| 5,656,821 A | * | 8/1997 | Sakuma ........................... 257/14 |
| 5,922,621 A | * | 7/1999 | Sakuma .......................... 438/733 |
| 6,265,733 B1 | * | 7/2001 | Shimoyama et al. ........... 257/94 |
| 7,693,199 B2 | * | 4/2010 | Imanishi et al. ............ 372/45.01 |
| 2003/0168666 A1 | * | 9/2003 | Okuyama et al. ............... 257/80 |
| 2006/0166386 A1 | * | 7/2006 | Yamada et al. .................. 438/22 |
| 2007/0120141 A1 | * | 5/2007 | Moustakas et al. ........... 257/103 |
| 2008/0315427 A1 | | 12/2008 | Seko |
| 2010/0327298 A1 | * | 12/2010 | Konno et al. .................... 257/94 |

FOREIGN PATENT DOCUMENTS

| | | | |
|---|---|---|---|
| JP | 05-063292 A | | 3/1993 |
| JP | 06-224516 A | | 8/1994 |
| JP | 2000277866 A | * | 10/2000 |
| JP | 2002-217450 A | | 8/2002 |
| JP | 2004-304090 A | | 10/2004 |
| JP | 2007-059623 A | | 3/2007 |
| JP | 2009-004487 A | | 1/2009 |
| JP | 2010-074121 A | | 4/2010 |

* cited by examiner

*Primary Examiner* — Cuong Q Nguyen
*Assistant Examiner* — Yosef Gebreyesus
(74) *Attorney, Agent, or Firm* — Holtz, Holtz, Goodman & Chick, P.C.

(57) ABSTRACT

A semiconductor light emitting device comprising a semiconductor layer of $(Al_yGa_{1-y})_xIn_{1-x}P$ ($0<x\leq1$, $0\leq y\leq1$) that consists of a first semiconductor layer of a first electrical conduction type, an active layer of a multiple quantum well structure containing a barrier layer and a distortion-containing well layer, a second semiconductor layer of a second electrical conduction type, and a third semiconductor layer of the second electrical conduction type, constructed in this order in the form of a generally flat laminate; a first electrode electrically connected to the first semiconductor layer; and a second electrode electrically connected to the third semiconductor layer; wherein part of the active layer facing the second semiconductor layer side is inclined from the surface of the active layer toward its normal, and the third semiconductor layer has a composition of $Ga_{1-z}In_zP$ ($0\leq z\leq0.35$).

6 Claims, 6 Drawing Sheets

FIG. 3B
FIG. 3A
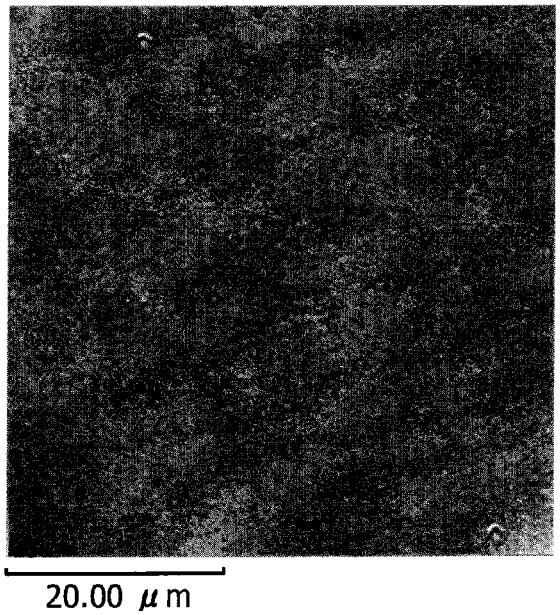

Distorted Quantum Well Structure

Distortion Compensation Type Quantum Well Structure

SEMICONDUCTOR LIGHT EMITTING DEVICE AND A PRODUCTION METHOD THEREOF

CROSS-REFERENCE TO RELATED APPLICATION

This application is based upon and claims the benefit of priority of the prior Japanese Patent Application No. JP 2010-064775, filed on Mar. 19, 2010, the entire contents of which are incorporated herein by reference.

BACKGROUND OF THE INVENTION

A) Field of the Invention

The present invention relates to a semiconductor light emitting device and a production method thereof.

B) Description of the Related Art

Semiconductor light emitting devices comprising AlGaInP type semiconductor material are the most widely used of the light emitting devices including red and other light emitting diodes. These devices are commonly constructed as described below (see, for instance, Japanese Unexamined Patent Publication (Kokai) No. 2004-304090 as Patent document 1, which is incorporated herein by reference, and U.S. Pat. No. 5,008,718 as Patent document 2, which is incorporated herein by reference).

A GaAs substrate is commonly used as growth substrate. An n-type Al(Ga)InP cladding layer, active layer, a p-type Al(Ga)InP cladding layer, and a current diffusion layer, are growth in this order on top of the substrate. The cladding layer contains an n-type dopant such as Si, Te, and Se and a p-type dopant such as Zn and Mg. The active layer is an AlGaInP or InGaP bulk layer or an AlGaInP or InGaP quantum well layer. In either case, the cladding layer has a higher Al content than the active layer. The current diffusion layer is commonly formed of GaP or AlGaAs.

In recent years, many high-brightness, high-efficiently AlGaInP light emitting diodes have been developed using a metallic mirror surface in a light emitting device. A semiconductor layer such as light emitting layer of an AlGaInP-based semiconductor is formed on a GaAs substrate that serves as growth substrate. Elsewhere, a metal layer is laminated on a support substrate of Si etc., and the semiconductor layer and the support substrate are joined with the metal layer sandwiched between them. Subsequently, the growth substrate, i.e. the GaAs substrate, is removed by etching etc. In addition, a light extraction structure may be formed on the surface of the AlGaInP light emitting layer to provide a semiconductor light emitting device with a high light extraction efficiency (see, for instance, Japanese Unexamined Patent Publication (Kokai) No. 2009-4487 as Patent document 3, which is incorporated herein by reference). High-brightness, high-efficiency light emitting diodes that contain such a metal layer for joining are called the metal bonding (MB) type. In the MB type light emitting diodes, the GaAs substrate, which absorbs the generated light, is eliminated, and the light generated in the direction away from the light extraction surface is reflected to achieve an increased light extraction efficiency.

Some documents (see, for instance, Japanese Unexamined Patent Publication (Kokai) No. 2002-217450 as Patent document 4, which is incorporated herein by reference, and Japanese Unexamined Patent Publication (Kokai) No. 2007-59623 as Patent document 5, which is incorporated herein by reference) have disclosed inventions to provide a metal mirror (reflecting surface) with an improved reflectance. The Patent documents 4 and 5 describe the production of a reflecting surface with regular reflection characteristics. The light beams generated in the light emitting layer toward a direction away from the light extraction surface is regularly reflected by the reflecting surface and directed toward the light extraction surface. Of the light beams incident on the light extraction surface, those with an angle of incidence smaller than the critical angle are extracted to improve the light extraction efficiency. The light beams with an angle of incidence larger than the critical angle continue propagating and they are finally absorbed by the semiconductor layer and cannot be extracted out.

The present inventors have disclosed an invention aiming to improve the light extraction efficiency by wet-etching the semiconductor layer's surface adjacent to the reflecting surface to make it anisotropically rough (see, for instance, Application Filing No. 2008-322066 as Patent document 6, which is incorporated herein by reference). This makes it possible to extract those light beams that are reflected by the reflecting surface and would come to the light extraction surface with an angle of incidence larger than the critical angle if there are no such anisotropic irregularities.

There are two disadvantages, however, in carrying out wet etching to form anisotropic irregularities on the semiconductor layer. First, the etching step has to be added. Second, such anisotropic irregularities tend to be formed in the direction of crystal orientation. Some regularity remains in the direction of crystal orientation, leaving a possibility to achieve a further improvement in the light extraction efficiency.

Commonly, the active layer of an AlGaInP based semiconductor light emitting device is in the form of a monolayer that can ensure an intended light emitting wavelength or is in the form of a quantum well structure. The quantum well structure is generally used in developing high-brightness semiconductor light emitting devices. To further improve the brightness, the lattice constants of AlGaInP in the well layer may be shifted intentionally from the lattice constants of GaAs in the growth substrate to distort the well layers, producing distorted quantum well layers.

FIG. 6A schematically shows a cross section of an active layer of a typical distorted quantum well structure. In the typical distorted quantum well structure, a period consisting of a distorted quantum well layer 20a and an undistorted barrier layer 20b adjacent to the distorted quantum well layer 20a is repeated several times to produce an active layer.

Some techniques to produce well layers with increased distortion have been developed (see, for instance, Japanese Unexamined Patent Publication (Kokai) No. HEI-06-224516 as Patent document 7, which is incorporated herein by reference). The Patent document 7 has disclosed a distortion compensation type quantum well structure that consists of well layers sandwiched between barrier layers having reversed distortion.

FIG. 6B schematically shows a cross section of an active layer having a distortion compensation type quantum well structure. In a distortion compensation type quantum well structure, a period consisting of a distorted quantum well layer 20a and a distorted barrier layer 20c adjacent to the distorted quantum well layer 20a is repeated several times to form an active layer. The distorted barrier layer 20c is distorted in an opposite manner to the distorted quantum well layer 20a.

The expected advantages of the distortion compensation type quantum well structure include easy prevention of crystal defects from being introduced when increasing the distortion of the well layers or increasing the number of repeated periods, achieving a uniform distribution of distortion in the quantum wells, and also achieving a uniform distribution of injected carrier density among the quantum wells, which will increase the light emitting efficiency.

There is a known method to change the refractive index distribution in the active layer through artificial processing of part of the growth substrate or growth layer (see, for instance, Japanese Unexamined Patent Publication (Kokai) No. HEI-05-63292 as Patent document 8, which is incorporated herein by reference). Such artificial processing is feared to cause some damage and contamination, and therefore, the method is not intended to process the active layer itself.

Thus, the quantum well structure is commonly designed so that both the composition and film thickness are uniform over the growth substrate and that the formation of crystal defects that decrease the light emitting efficiency are prevented.

SUMMARY OF THE INVENTION

The invention aims to provide a semiconductor light emitting device with a high light extraction efficiency and a production method thereof.

An aspect of the invention provides a semiconductor light emitting device comprising a semiconductor layer of $(Al_yGa_{1-y})_xIn_{1-x}P$ ($0<x\leq1$, $0\leq y\leq1$) that consists of a first semiconductor layer of a first electrical conduction type, an active layer of a multiple quantum well structure containing a barrier layer and a distortion-containing well layer, a second semiconductor layer of a second electrical conduction type, and a third semiconductor layer of the second electrical conduction type, constructed in this order in the form of a generally flat laminate; a first electrode electrically connected to the first semiconductor layer; and a second electrode electrically connected to the third semiconductor layer; wherein part of the active layer facing the second semiconductor layer side is inclined from the surface of the active layer toward its normal, and the third semiconductor layer has a composition of $Ga_{1-z}In_zP$ ($0\leq z\leq0.35$).

Another aspect of the invention provides A semiconductor light emitting device production method comprising (a) a step of preparing a growth substrate; (b) a step of producing, on the growth substrate, a semiconductor layer of $(Al_yGa_{1-y})_xIn_{1-x}P$ ($0<x\leq1$, $0\leq y\leq1$) that consists of a first semiconductor layer of a first electrical conduction type, an active layer of a multiple quantum well structure containing barrier layers and distortion-containing well layers, a second semiconductor layer of a second electrical conduction type, and a third semiconductor layer of the second electrical conduction type, constructed in this order from the growth substrate to provide a generally flat laminate; and (c) a step of producing a first electrode electrically connected to the first semiconductor layer and a second electrode electrically connected to the third semiconductor layer; wherein the barrier layer is grown at a growth rate of 0.5 nm/sec or more in the step (b) and the third semiconductor layer is formed of $Ga_{1-z}In_zP$ ($0\leq z\leq0.35$).

According to the invention, it is possible to provide a semiconductor light emitting device with a high light extraction efficiency and a production method thereof.

BRIEF DESCRIPTION OF DRAWINGS

FIGS. 3A and 3B show a photograph that illustrates the semiconductor layer of a semiconductor light emitting device according to a comparative example.

DESCRIPTION OF EMBODIMENTS

Figure 1A:
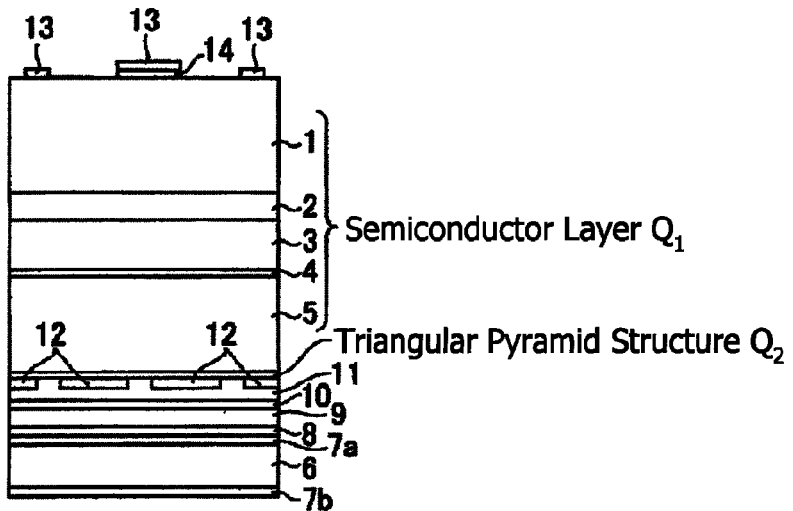
FIGS. 1A and 1B show a schematic diagram of a semiconductor light emitting device according to the embodiment.
Figure 1B:
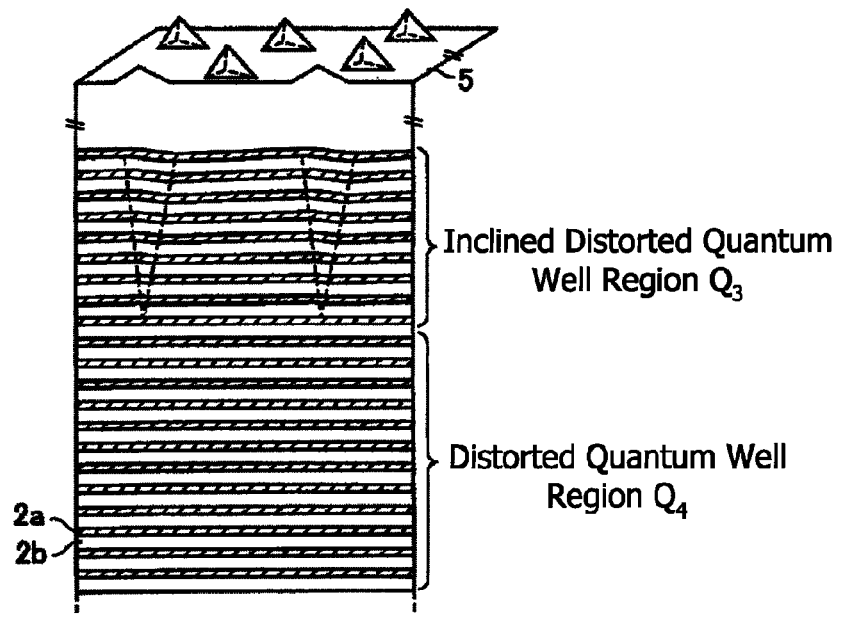

FIGS. 1A and 1B show a schematic diagram of a semiconductor light emitting device according to the embodiment.

See FIG. 1A. The semiconductor light emitting device according to the embodiment comprises an electrically conductive support substrate 6, ohmic metal layers 7a and 7b provided on either side of the electrically conductive support substrate 6, a contact layer 8, a composite joining layer 9, a barrier layer 10, and a reflecting electrode layer 11, the latter four being formed on the ohmic metal layer 7a. An insulation layer 12 is formed in some portions of the reflecting electrode layer 11.

A semiconductor layer of an AlGaInP based material is provided over the reflecting electrode layer 11 and the insulation layer 12. The semiconductor layer $Q_1$ is a generally flat laminate that consists of a p-type transparent electrically conductive layer 5, a p-type AlGaInP interlayer 4, a p-type AlGaInP cladding layer 3, an AlGaInP active layer 2, and an n-type AlGaInP cladding layer 1, constructed in this order on the reflecting electrode layer 11 and the insulation layer 12. Triangular pyramid structures $Q_2$ are formed on the surface of the p-type transparent electrically conductive layer 5 facing the reflecting electrode layer 11 and insulation layer 12. An n-type schottky electrode layer 14 and an n-type ohmic electrode layer 13 are formed on the surface of the n-type AlGaInP cladding layer 1.

Light beams generated in the active layer 2 are extracted through the n-type AlGaInP cladding layer 1. In addition to functioning as a p-type electrode, the reflecting electrode layer 11 reflects light generated in the active layer 2 to increase the light extraction efficiency.

FIG. 1B shows the active layer 2 in detail. The AlGaInP active layer 2 has a multiple distorted quantum well structure consisting of distorted well layers 2a, which are distorted, and undistorted barrier layers 2b, which are not distorted. These layers are arranged alternately. The active layer 2 contains slight inclination portions adjacent to the p-type AlGaInP cladding layer 3. In the slight inclination portions, the distorted well layers 2a and undistorted barrier layers 2b are inclined from the surface of the active layer 2 at, for instance, an angle of 4.9° or more and 20° or less toward the normal. In this figure, the slight inclination portions are the V-shaped parts indicated by broken lines. The inclination starts at the distorted well layer 2a located at the valley of the V-shaped parts. In the figure, the part of the active layer 2 (multiple distorted quantum well structure) that contains the slight inclination portions where the layers 2a and 2b are inclined is referred to as inclined distorted quantum well region $Q_3$, and the remaining part that does not contain slight inclination portions where the layers 2a and 2b are inclined is referred to as distorted quantum well region $Q_4$. As described later, the semiconductor light emitting device according to the embodiment is a semiconductor light emitting device with a high light extraction efficiency.

Figure 2:
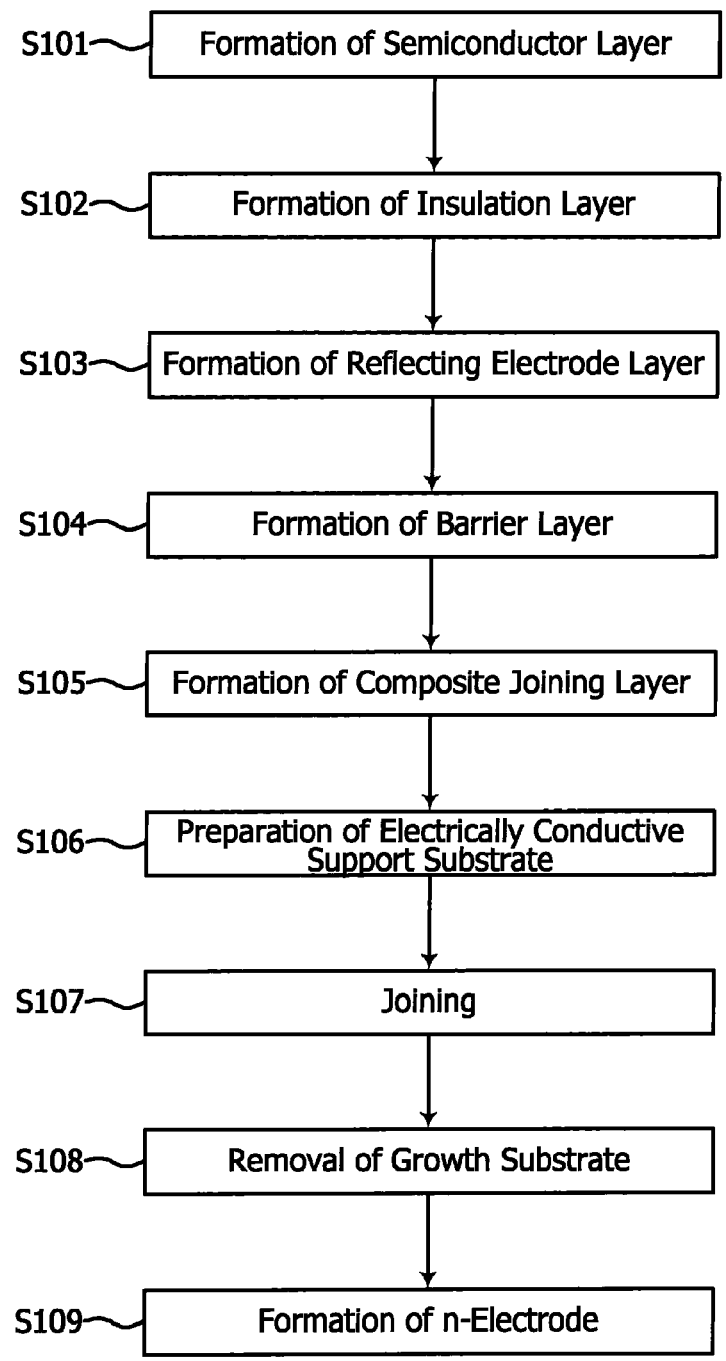
FIG. 2 shows a flow chart of a production method for the semiconductor light emitting device according to the embodiment.

FIG. 2 shows a flow chart of a production method for the semiconductor light emitting device according to the embodiment. First, semiconductor layers 1 to 5 are formed on a growth substrate, e.g. an n-type GaAs substrate (step S101). By metal organic chemical vapor deposition (MOCVD), a n-type GaAs buffer layer, an n-type AlGaInP cladding layer 1, an AlGaInP active layer 2, a p-type AlGaInP cladding layer 3, a p-type AlGaInP interlayer 4, and a p-type transparent electrically conductive layer 5 were laminated in this order on the n-type GaAs substrate In forming the semiconductor layers 1 to 5, arsine ($AsH_3$) and phosphine ($PH_3$) were used as Group-V materials, and organometallic substances such as trimethylgallium (TMG), trimethylaluminum (TMA), and trimethylindium (TMI) were employed as Group-III materials. In addition, silane ($SiH_4$) was used as Si component of n-type impurities, and dimethyl zinc (DMZn) was employed as Zn component of p-type impurities. The growth temperature was 750 to 850° C. Hydrogen gas was used as carrier gas, and the growth pressure was 10 kPa.

An insulating layer 12 of, for instance, $SiO_2$ is formed on some portions of the p-type transparent electrically conductive layer 5 (step S102). An insulating film is produced first, and some portions of the film are removed by etching.

A reflecting electrode layer 11 with a thickness of, for instance, 300 nm is formed over the p-type transparent electrically conductive layer 5 and the insulating layer 12 (step S103). The reflecting electrode layer 11 is made of a metal, such as AuZn, that makes ohmic contact with the p-type transparent electrically conductive layer 5. The reflecting electrode layer 11 may be formed by a method such as resistance heating deposition, electron beam deposition, and sputtering.

A barrier layer 10 of, for instance, TaN/TiW/TaN, is formed on the reflecting electrode layer 11 (step S104). The TaN/TiW/TaN laminated structure can be formed by, for instance, reactive sputtering. Each of the TaN, TiW, and TaN layers has a thickness of, for instance, 100 nm.

A composite joining layer 9 is formed on the barrier layer 10 (step S105). The composite joining layer 9 is produced in the form of a Ni/Au laminate. The Ni layer formed on the barrier layer 10 has a thickness of, for instance, 300 nm, and the Au layer on the Ni layer has a thickness of, for instance, 30 nm. The Ni layer can be formed by electron beam deposition, sputtering, etc. The Au layer can be formed by resistance heating deposition, sputtering, etc.

Elsewhere, ohmic metal layers 7a and 7b are deposited on either side of an electrically conductive support substrate 6, followed by forming a contact layer 8 and a composite joining layer 9 in this order on the ohmic metal layer 7a (step S106). The electrically conductive support substrate 6 is in the form of a Si substrate containing p-type impurities such as B. The support substrate 6 may also be made of Ge, Cu, sapphire, SiC or $SiO_2$-based glass, instead of Si.

The ohmic metal layers 7a and 7b each are a Pt layer with a thickness of, for instance, 25 nm or more, and can be produced by resistance heating deposition, electron beam deposition, sputtering, etc. The contact layer 8 is formed of, for instance, AuSn with a Au-to-Sn ratio by weight of about 8:2. Its thickness is, for instance, 600 nm. It can be produced by resistance heating deposition, sputtering, etc. The composite joining layer 9 on the contact layer 8 is also formed as a Ni/Au laminate as in the case of the similar layer on the barrier layer 10.

The laminated structure on the growth substrate is joined with the electrically conductive support substrate 6 (step S107). The two are held with the two composite joining layers 9 facing each other, and bonded under pressure in a nitrogen atmosphere. The growth substrate and the electrically conductive support substrate 6 are joined with their respective composite joining layer 9 sandwiched between them.

The growth substrate, i.e. the GaAs substrate, is removed (step S108). The removal can be carried out by wet etching with, for instance, a liquid mixture of aqueous ammonia and a hydrogen peroxide solution.

A n-electrode is formed on the n-type AlGaInP cladding layer 1 exposed after the removal of the growth substrate, forming a semiconductor wafer (step S109). The n-type ohmic electrode layer 13 used was in the form of a AuGeNi/TaN/Ta/Au laminate structure, and the n-type schottky electrode layer 14 used is in the form of a Ta/TiWN/Ta/Au laminate structure.

In this way, a semiconductor light emitting device according to the embodiment is completed.

The semiconductor layers 1 to 5 are described in detail below. Prior to describing the embodiment, comparative examples are addressed first.

Details of the semiconductor layers in a semiconductor light emitting device according to comparative examples are as follows. The growth substrate used was a GaAs substrate with an inclination of 15° from the (100) plane to the [011] direction. An n-type AlGaInP cladding layer was produced in the form of an n-type $(Al_{0.7}Ga_{0.3})_{0.5}In_{0.5}P$ layer with a thickness of 3 μm. In the AlGaInP active layer, the distorted well layers and the undistorted barrier layers were in the form of $Ga_{0.49}In_{0.51}P$ layers with a thickness of 3 nm and $(Al_{0.56}Ga_{0.44})_{0.5}In_{0.5}P$ layers with a thickness of 7 nm, respectively. The growth speed of the undistorted barrier layers was adjusted to 0.29 nm/sec. A total of 43 distorted well layers were produced, and the quantity of distortion (lattice misfit) was adjusted to a compressive strain of 4500 ppm (+4500 ppm). The p-type AlGaInP cladding layer was a $(Al_{0.7}Ga_{0.3})_{0.5}In_{0.5}P$ layer with a thickness of 1 μm, and the p-type AlGaInP interlayer was a $(Al_{0.56}Ga_{0.44})_{0.5}In_{0.5}P$ layer with a thickness of 20 nm. The p-type transparent electrically conductive layer was a GaP layer with a thickness of 1 μm.

FIGS. 3A and 3B show photographs that illustrate semiconductor layers in a semiconductor light emitting device according to comparative example. FIG. 3A shows an AFM photograph of the surface of the p-type transparent electrically conductive layer. The surface is even, and no anomalous features are found. FIG. 3B shows a TEM photograph of a cross section of the distorted quantum well structure. Both the distorted well layers and the undistorted barrier layers are found to have uniform surfaces.

The semiconductor layers in a semiconductor light emitting device according to the embodiment is described next. The growth substrate used was a GaAs substrate with an inclination of 15° from the (100) plane to the [011] direction. An n-type AlGaInP cladding layer 1 was produced in the form of an n-type $(Al_{0.7}Ga_{0.3})_{0.5}In_{0.5}P$ layer with a thickness of 3 μm. In the AlGaInP active layer 2, the distorted well layers 2a and the undistorted barrier layers 2b were in the form of $Ga_{0.49}In_{0.51}P$ layers with a thickness of 3 nm and $(Al_{0.56}Ga_{0.44})_{0.5}In_{0.5}P$ layers with a thickness of 7 nm, respectively. The growth speed of the undistorted barrier layer 2b was adjusted to 0.56 nm/sec. A total of 43 distorted well layers 2a (total thickness of the distorted well layers of 132 nm) were produced, and the quantity of distortion given to the distorted well layers in the active layer 2 production step was adjusted to +4500 ppm. Distortion was not given to the undistorted barrier layers 2b. The quantity of distortion was set up based on the lattice constants of the growth substrate, i.e. the GaAs substrate, considering the thermal expansion expected to take place during growth. The p-type AlGaInP cladding layer 3 was a $(Al_{0.7}Ga_{0.3})_{0.5}In_{0.5}P$ layer with a thickness of 1 μm, and the p-type AlGaInP interlayer 4 was a $(Al_{0.56}Ga_{0.44})_{0.5}In_{0.5}P$ layer with a thickness of 20 nm. The p-type transparent electrically conductive layer 5 was a GaP layer with a thickness of 1 μm.

Figure 4A:
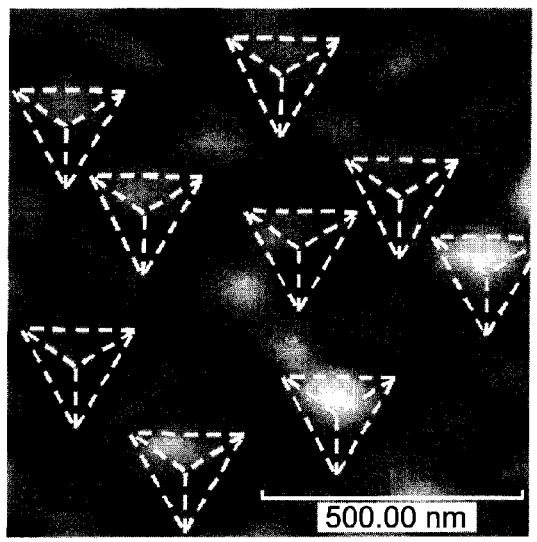
FIG. 4A to 4C show a photograph that illustrates the semiconductor layer of a semiconductor light emitting device according the embodiment.
Figure 4B:
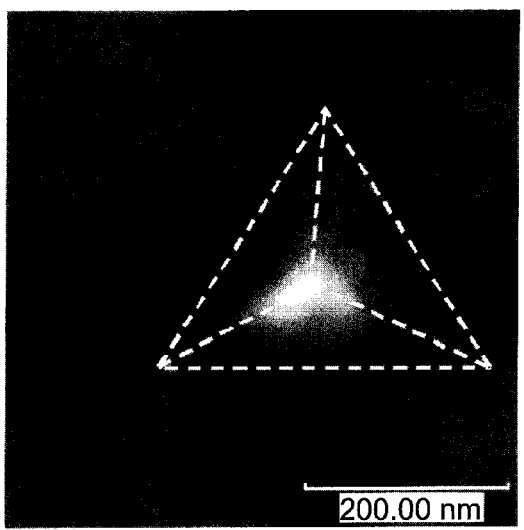
Figure 4C:
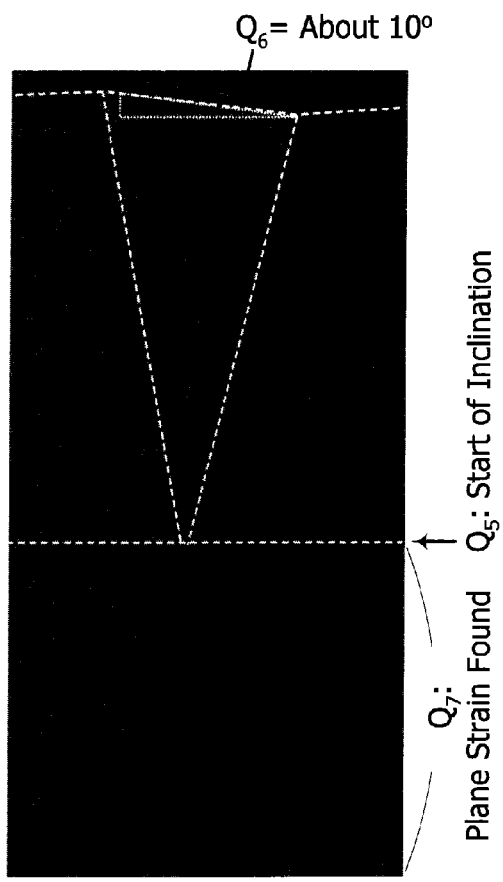

FIG. 4A to 4C show photographs that illustrate semiconductor layers in the semiconductor light emitting device according to the embodiment. FIG. 4A shows an AFM photograph of the surface of the p-type transparent electrically conductive layer 5. It is seen that several triangular pyramid structures (projections) are formed on the surface. The number of the triangular pyramid structures is, for instance, 4 to 6 on a 1,000 nm line (2 to 3 on a 500 nm line) on the surface of the p-type transparent electrically conductive layer 5. In the embodiment, the density of the triangular pyramid structures found on the surface of the p-type transparent electrically conductive layer 5 was about $1.2 \times 10^9$ $cm^{-2}$ in an area of 1 μm×1 μm.

FIG. 4B shows an enlarged photograph of a triangular pyramid structure. Observations of several triangular pyramid structures indicate that the width of a triangular pyramid structure (a side of the triangular face (bottom face) on the surface of a p-type transparent electrically conductive layer 5) was in the range of 200 to 400 nm. The height was 30 to 80 nm.

Studies of the present inventors have shown that the size of the triangular pyramid structures can be changed by controlling the thickness of the p-type transparent electrically conductive layer 5. The size of the triangular pyramid structures tends to increase with an increasing thickness of the p-type transparent electrically conductive layer 5.

FIG. 4C shows a TEM photograph of a cross section of the quantum well zone (active layer 2) located below the triangular pyramid structures. It is clearly seen that part of the quantum well structure starts to incline slightly at a certain position $Q_5$ in the distorted quantum well structure, and a distorted quantum well structure partially having inclination is finally formed. The angle of inclination $Q_6$ is about 10°. On both sides of the inclination portions, layers have grown in the parallel direction to those below the layer where the inclination starts. The layers $Q_7$ below the layer where the inclination starts contain a plane strain.

There were 2 to 3 inclination portions on average in a 500 nm measured view of a distorted quantum well structure. Though it is technically difficult to carry out TEM observation of cross sections of all triangular pyramid structures, the number of the triangular pyramid structures agrees with that of the inclination portions in the distorted quantum well structure as described above. This suggests that that triangular pyramid structures originate in the inclination portions in the quantum well structure. Therefore, the density of the inclination portions in the quantum well structure can be estimated indirectly from that of the triangular pyramid structures on the surface of the p-type transparent electrically conductive layer 5.

Connecting several inclination portions adjacent to each other in the quantum well structure, the inclination starting points were found roughly in the same layers, as seen, for instance, from FIG. 1B. The ratio of inclination between the quantum well structure free from inclination portions (the distorted quantum well region in FIG. 1B) and the quantum well structure containing inclination portions (the inclined distorted quantum well region in FIG. 1B) was roughly in the range of 5:5 to 7:3 in the direction of the thickness of the active layer 2. This indicates that the thickness of the quantum well structure containing inclination portions accounted for 30% or more and 50% or less of the entire thickness of the active layer 2. It is inferred that the quantum well structure free from inclination portions should have a size above a certain level to act as base, and the inclination portions should have a volume above a certain level to allow triangular pyramid structures to form.

Comparison between the light output of a semiconductor light emitting device according to the embodiment and that of a semiconductor light emitting device according to comparative examples showed that the former was 15% larger than the latter. This is considered to be because in the semiconductor light emitting device according to the embodiment, the triangular pyramid structures on the semiconductor layer 5 on the reflecting surface (reflecting electrode layer 11) effectively served to extract those light beams that were generated in the active layer 2 and directed toward the reflecting surface, and would have been reflected by the reflecting surface and reached the light extraction surface at an incidence angle larger than the critical angle if not for the triangular pyramid structures.

The present inventors constructed semiconductor light emitting devices according to the embodiment in which the number of the distorted well layers 2a was 15 (the total thickness of the distorted well layers 2a was 45 nm), 30 (the total thickness of the distorted well layers 2a was 90 nm), or 50 (the total thickness of the distorted well layers 2a was 150 nm). In these semiconductor light emitting devices, it was found that triangular pyramid structures were formed on the surface of the p-type transparent electrically conductive layer 5, leading to a large light output.

The present inventors also constructed semiconductor light emitting devices according to the embodiment in which the quantity of distortion of the distorted well layer 2a was +7000 ppm, +6000 ppm, or +3000 ppm. In these semiconductor light emitting devices, it was also found that triangular pyramid structures were formed on the surface of the p-type transparent electrically conductive layer 5, leading to a large light output.

If the distorted quantum well structure exceeds the critical film thickness, on the other hand, the quantum well structure will suffer crystal defects and fail to function as a light emitting device. The present inventors carried out tests with semiconductor light emitting devices according to the embodiment that contained a total of 10 distorted well layers 2a, and found no triangular pyramid structures formed. This is considered to be because the total thickness of the distorted well layers 2a (a thickness of 3 nm per layer) was a relatively small 30 nm, and therefore, a sufficient quantity of distortion was not achieved for the formation of triangular pyramid structures. To allow a likely precursor of the triangular pyramid structure (a structure similar to a distorted quantum well structure containing some portions where layers have a small inclination starting at some inside points) to form, it is important at least that the quantity of distortion of the distorted well layers 2a is not so large that the thickness exceeds the critical level and that the distortion given to the distorted well layers 2a is accumulated across the entire wafer that is growing.

If the total thickness of the distorted well layers 2a is 40 nm or more and 150 nm or less and the quantity of distortion given to the distorted well layers 2a is equivalent to a compressive strain of 3000 ppm or more and 7000 ppm or less, it will be possible to obtain a high-output semiconductor light emitting device in which the active layer 2 contains slight inclination portions and triangular pyramid structures are formed on the surface of the p-type transparent electrically conductive layer 5.

The present inventors continued tests with the semiconductor layers in semiconductor light emitting devices according to the embodiment. First, wafers having the same semiconductor layer structure as in the embodiment were constructed using GaAs substrates with an inclination of 4°, 10°, or 15° from the (100) plane to the [011] direction as growth substrates and changing the growth rate of the undistorted barrier layers 2b in the range of about 0.26 to 0.8 nm/sec, followed by examining the density of the triangular pyramid structures formed on the surface of the p-type transparent electrically conductive layer 5. As these substrates have an inclination from the (100) principal plane to the [011] direction, there exist steps of the atomic layer level (atomic layer steps) on the surface of the substrates. A larger number of atomic layer steps exist (a larger step density occurs) with an increasing inclination angle.

Figure 5:
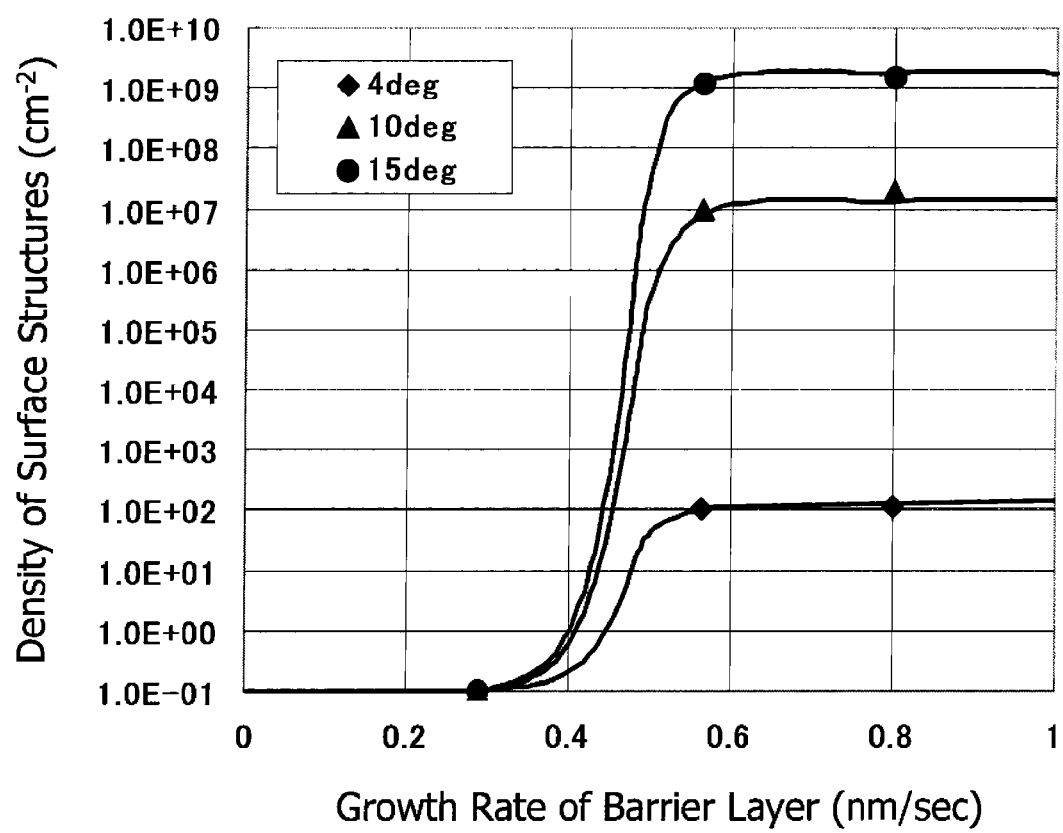
FIG. 5 shows a graph that illustrates the relation between the growth rate of the undistorted barrier layers 2b and the density of the triangular pyramid structures.
Figure 6A:
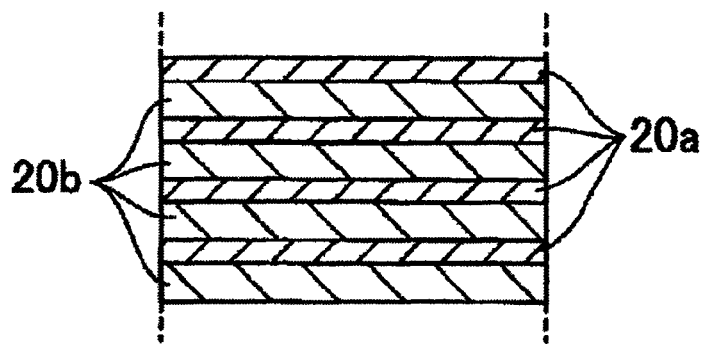
FIG. 6A schematically shows a cross section of an active layer of an ordinary distorted quantum well structure, and FIG. 6B schematically shows a cross section of an active layer of a distortion compensation type quantum well structure.
Figure 6B:
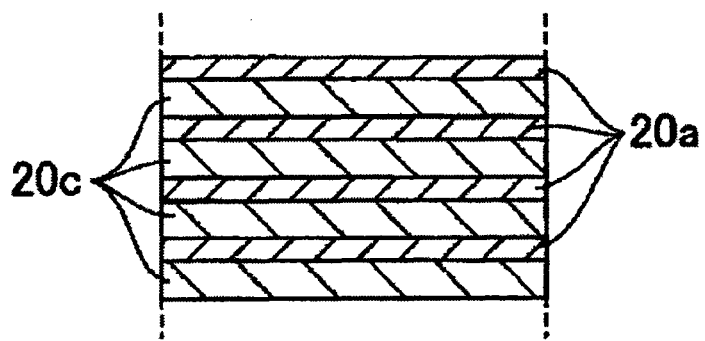

FIG. 5 shows a graph illustrating the relation between the growth rate of the undistorted barrier layers 2b and the density of the triangular pyramid structures. The horizontal axis represents the growth rate of the undistorted barrier layers 2b in nm/sec, while the longitudinal axis represents the density of the triangular pyramid structures in cm$^{-2}$. The curve connecting black rhombi shows their relation for an inclination angle of 4°, and the curves connecting black triangles and circles show their relation for an inclination angle of 10° and 15°, respectively.

It is seen that the density of the triangular pyramid structures depends on the angle of inclination in the growth substrate, i.e. the GaAs substrate, and the number of the triangular pyramid structures formed increases with an increasing inclination angle. This is considered to result from the fact that the density of steps existing on the crystal surfaces increases with an increasing inclination angle, and a larger number of triangular pyramid structures grow from them. On a growth substrate that has a surface with a plane inclination from the original direction toward another, it becomes more likely that crystal planes of different plane directions are exposed at the edges of atomic layer steps. It is considered, therefore, that the growth in the crystal planes of fast-growing plane directions that are exposed at the edges of atomic layer steps was accelerated, and this had influence.

It is also seen that the density of the triangular pyramid structures depends on the growth rate of the undistorted barrier layers 2b in the distorted quantum well structure. The density of the triangular pyramid structures formed on the surface of the p-type transparent electrically conductive layer 5 can be increased by causing the undistorted barrier layers 2b to grow at a growth rate of 0.5 nm/sec or more.

Thus it is inferred as follows. Local concentration of crystal distortion takes place in some portions on the outermost surface of the quantum well layer region as the quantity of well layer distortion in the distorted quantum well layers and the total thickness of the well layers reach a certain limit where crystal defects do not occur. As material gas reaches distortion concentrated portions at a speed above a certain level, the growth of crystal planes with different growth rates is accelerated.

This local anisotropic growth taking place in the distorted quantum well structure leads to the formation of a light emitting device with slight inclinations of crystal planes in some portions of the distorted quantum well structure. Though the inclinations of crystal planes taking place in the quantum well structure region are moderate, their three dimensional growth is considered to be accelerated as a result of continued growth from the quantum well structure region. Furthermore, the transparent electrically conductive layer 5, which comprises GaP which has largely different lattice constants with a lattice misfit of about 3.4%, exists on the outermost surface of the semiconductor layers, and this is considered to lead to the formation of triangular pyramid structures with large inclinations. A GaP layer is used as the p-type transparent electrically conductive layer 5 in the embodiment, but the same effect can be achieved using an appropriate Ga$_{1-x}$In$_x$P (0≦x≦0.35) material with a lattice misfit of 1% or more. Here, it is preferable that the barrier layers do not have the ability to compensate the distortion in the distorted well layers, and it is preferable that the barrier layers are free from distortion (less than ±1000 ppm for the present invention).

Then, the inventors constructed semiconductor light emitting devices (investigative examples) of the same semiconductor layer structure as in the embodiment for which the growth rate of the undistorted barrier layers 2b was adjusted to about 0.56 nm/sec and a GaAs substrate with an inclination of 4°, 7°, 10°, 15°, or 25° from the (100) plane to the [011] direction was used as growth substrate. Their light output was compared with that of devices constructed according to comparative examples where the undistorted barrier layers were grown at a growth rate of 0.29 nm/sec (in the GaAs growth substrates, the inclination angle from the (100) plane to the [011] direction was 4°, 7°, 10°, 15°, or 25°).

Comparison between investigative examples with an inclination angle of 4° and comparative examples with an inclination angle of 4° showed no significant difference in light output.

Comparison between investigative examples with an inclination angle of 7° and comparative examples with an inclination angle of 7° showed that the light output of the former is larger by several percent than that of the latter.

Comparison between investigative examples with an inclination angle of 10° and comparative examples with an inclination angle of 10° showed that the light output of the former is larger by about 10% than that of the latter.

Comparison between investigative examples (the embodiment) with an inclination angle of 15° and comparative examples with an inclination angle of 15° showed that the light output of the former is larger by 15% than that of the latter.

Comparison between investigative examples with an inclination angle of 25° and comparative examples with an inclination angle of 25° showed that the light output of the former is larger by 15% than that of the latter.

It is seen that the light output is improved only slightly if the inclination angle in the growth substrate is small. This may be because the density of the triangular pyramid structures is small when the inclination angle is small. Even when, for instance, the inclination angle in the substrate was 4°, triangular pyramid structures were formed in the semiconductor light emitting device of the investigative examples. Their density, however, was only about 1,000 cm$^{-2}$. It is likely that this led to the insufficient light extraction and the small light output of the same level as in the comparative examples.

The inclination angle in the slight inclination portions existing in the quantum wells has a correlation with the inclination angle in the growth substrate. For instance, as described above with reference to FIG. 4C, the inclination angle in the slight inclination portions in the quantum wells is about 10° when the inclination angle in the growth substrate is 15°. Thus, the inclination angle in the slight inclination portions in the quantum wells is slightly smaller than the inclination angle in the growth substrate. When a growth substrate with a small inclination angle, e.g. a growth substrate with an inclination angle 4°, is used, it is also impossible to achieve a sufficient inclination in the slight inclination portions in the quantum wells, possibly resulting in difficulty for triangular pyramid structures to form. The inclination angle in the slight inclination portions in the quantum wells was 2° when the inclination angle in the growth substrate was 4°.

Comparison between investigative examples and comparative examples suggests that the light output increases if the inclination angle is at least 7° or more. The inclination angle in the slight inclination portions in the quantum wells was 4.9° when the inclination angle in the growth substrate was 7°.

The inclination angle in the growth substrate may be 10° or more if a light output improvement of about 10% or more is required. In this case, the density of the triangular pyramid structures is roughly 10,000 cm$^{-2}$ or more. The inclination angle in the slight inclination portions in the quantum wells was 7° when the inclination angle in the growth substrate was 10°.

Comparison between cases where the inclination angle in the growth substrate is 15° and cases where it is 25° shows no significant difference in light output improvement. This may be because the number of triangular pyramid structures approaches the saturation level. Further improvement in the light output cannot be expected if the inclination angle in the slight inclination portions in the quantum wells exceeds 25°. The inclination angle in the slight inclination portions in the quantum wells was 17.5° when the inclination angle in the growth substrate was 25°.

These results indicate that the inclination angle in the slight inclination portions in the quantum wells is preferably 4.9° or more and 20° or less, more preferably 7° or more and 17.5° or less. The inclination angle in the growth substrate is preferably 7° or more and 25° or less.

Thus, the invention is described above with reference to the embodiment, but it should be noted that the invention is not limited thereto.

For instance, the constitution, composition, thickness, etc., of the cladding layer and the interlayer in the embodiment may be changed. As an example, the cladding layer is a layer of $(Al_{0.7}Ga_{0.3})_{0.5}In_{0.5}P$ in the embodiment, but it may be a layer of $Al_{0.5}In_{0.5}P$ Furthermore, the distorted well layers 2a are layers of $Ga_{0.49}In_{0.51}P$ in the embodiment, but the distorted well layers may contain Al.

In addition, the undistorted barrier layers 2b are layers of $(Al_{0.56}Ga_{0.44})_{0.5}In_{0.5}P$ in the embodiment, but the content of Al may be changed.

Generally, the semiconductor layers 1 to 5 may have a composition of $(Al_yGa_{1-y})_xIn_{1-x}P$ ($0<x\leq 1$, $0\leq y\leq 1$).

The embodiment presents a MB type semiconductor light emitting device that uses a metal layer for bonding, but the GaAs substrate may remain in the semiconductor light emitting device. In that case, the efficiency of light extraction from the surface can be improved by means of triangular pyramid surface structures.

Furthermore, the semiconductor layer should, as a minimum requirement, contain a first semiconductor layer of a first electrical conduction type (n-type) (n-type AlGaInP cladding layer 1 is in the embodiment), an active layer to generate light (AlGaInP active layer 2 in the embodiment), a second semiconductor layer of a second electrical conduction type (p-type) (p-type AlGaInP cladding layer 3 in the embodiment), and a third semiconductor layer of the second electrical conduction type (p-type transparent electrically conductive layer 5 in the embodiment), formed in this order from the growth substrate. The semiconductor light emitting device contains a first electrode electrically connected to the first semiconductor layer and a second electrode electrically connected to the third semiconductor layer.

As is easily understood by those in the art, other various changes, improvements, and combinations may be possible.

As an example, the invention can be applied effectively to AlGaInP-based MB-type semiconductor light emitting devices that use a metal layer for joining.

What we claim are:

1. A semiconductor light emitting device comprising:
   a semiconductor layer of $(Al_yGa_{1-y})_xIn_{1-x}P$ ($0<x\leq 1$, $0\leq y\leq 1$) that consists of, in order, a first semiconductor layer of a first electrical conduction type, an active layer of a multiple quantum well structure containing a barrier layer and a distortion-containing well layer, a second semiconductor layer of a second electrical conduction type, and a third semiconductor layer of said second electrical conduction type, wherein the semiconductor layer is constructed in the form of a substantially flat laminate;
   a first electrode electrically connected to said first semiconductor layer; and
   a second electrode electrically connected to said third semiconductor layer;
   wherein a part of said active layer located on a second semiconductor layer side is inclined from a surface of the active layer toward its normal,
   wherein said third semiconductor layer has a composition of $Ga_{1-z}In_zP$ ($0\leq z\leq 0.35$), and
   wherein a triangular pyramid structure is formed on a surface of the third semiconductor layer just above the inclined part of the active layer.

2. The semiconductor light emitting device as claimed in claim 1, wherein said part of the active layer located on the second semiconductor layer side is inclined 4.9° or more and 20° or less from the surface of the active layer toward the normal.

3. The semiconductor light emitting device as claimed in claim 2, wherein said part of the active layer located on the second semiconductor layer side is inclined 7° or more and 17.5° or less from the surface of the active layer toward the normal.

4. The semiconductor light emitting device as claimed in claim 1, wherein said barrier layer is free from distortion, a total thickness of a plurality of said well layers is 40 nm or more and 150 nm or less, and the distortion of said well layers is equivalent to a compressive strain of 3000 ppm or more and 7000 ppm or less.

5. The semiconductor light emitting device as claimed in claim 1, wherein a thickness of said part inclined from the surface of said active layer toward the normal is 30% or more and 50% or less of a total thickness of said active layer.

6. The semiconductor light emitting device as claimed in claim 1, wherein said second electrode comprises a reflecting electrode formed on said third semiconductor layer, and wherein a surface of said reflecting electrode opposite to a surface facing said third semiconductor layer is bonded to an electrically conductive support substrate.

* * * * *